(12) United States Patent
Takita (10) Patent No.: US 7,550,902 B2
(45) Date of Patent: Jun. 23, 2009

(54) ELECTRONIC COMPONENT DEVICE

(75) Inventor: Rintaro Takita, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 505 days.

(21) Appl. No.: 10/559,606

(22) PCT Filed: May 26, 2004

(86) PCT No.: PCT/JP2004/007175

§ 371 (c)(1), (2), (4) Date: Dec. 1, 2005

(87) PCT Pub. No.: WO2004/109796

PCT Pub. Date: Dec. 16, 2004

(65) Prior Publication Data

US 2006/0118928 A1   Jun. 8, 2006

(30) Foreign Application Priority Data

Jun. 3, 2003  (JP) .............................. 2003-158318

(51) Int. Cl.
*H01L 41/047* (2006.01)
*H01L 41/053* (2006.01)
(52) U.S. Cl. ..................... 310/344; 310/346; 310/365
(58) Field of Classification Search .................. 310/344, 310/346, 365
See application file for complete search history.

(56) References Cited

U.S. PATENT DOCUMENTS 5,302,880 A * 4/1994 Kaida ......................... 310/370
6,229,248 B1 * 5/2001 Kusabiraki et al. .......... 310/348
7,259,032 B2 * 8/2007 Murata et al. ................. 438/26

FOREIGN PATENT DOCUMENTS

| JP | 55-049013 A | * 4/1980 | ................. 310/344 |
| JP | 57-060717 A | * 4/1982 | ................. 310/344 |
| JP | 4-293310 | 10/1992 | |
| JP | 7-50360 | 2/1995 | |
| JP | 9-266263 | 10/1997 | |
| JP | 2002-170895 | 6/2002 | |
| JP | 2002-198761 | 7/2002 | |

* cited by examiner

Primary Examiner—Thomas M Dougherty
(74) Attorney, Agent, or Firm—Keating & Bennett, LLP (57) ABSTRACT

An electronic component having thermal shock resistance and high reliability includes an element having a functional part and a first frame-shaped electrode surrounding the functional part, a substrate including a second frame-shaped electrode, and a solder sealing frame provided on the surface of at least one of the first frame-shaped electrode and the second frame-shaped electrode. In the electronic component device, the element and the substrate are bonded with the solder sealing frame, and the functional part provided on the element is hermetically sealed in a space formed between the element and the substrate. When the difference in expansion in the x direction between the element and the substrate is represented by $Q_x$ and the difference in expansion in the y direction between the element and the substrate is represented by $Q_y$, then in each of the first frame-shaped electrode, the second frame-shaped electrode, and the solder sealing frame, a width of a strip-shaped portion extending in the direction having the larger difference in expansion is smaller than a width of a strip-shaped portion extending in the direction having the smaller difference in expansion.

7 Claims, 7 Drawing Sheets

ELECTRONIC COMPONENT DEVICE

BACKGROUND OF THE INVENTION

1. Field of the Invention

The present invention relates to an electronic component device in which a rectangular plate-shaped electronic component element having a functional part thereon is mounted on a substrate with bumps. In further detail, the present invention relates to an electronic component device in which a rectangular plate-shaped electronic component element is mounted on a substrate so that a functional part of the electronic component element is hermetically sealed. The electronic component element has a coefficient of linear expansion in the x direction along a side of the rectangle and a coefficient of linear expansion in the y direction orthogonal to the x direction in the plane of the rectangle, wherein the coefficients of linear expansion being different from each other.

2. Description of the Related Art

Hitherto, various electronic component devices in which an electronic component element (hereinafter also abbreviated to as an element), such as a SAW element or a high-frequency element, is installed on a substrate have been proposed.

For example, Japanese Unexamined Patent Application Publication No. 4-293310 discloses a surface acoustic wave device in which a SAW element is mounted on a base plate with bumps. In more detail, hot-side lands are provided on a surface of the base plate and solder bumps are provided on the corresponding hot-side lands. In addition, a frame-shaped earth-side land is provided on the surface of the base plate so as to surround the hot-side lands. A solder sealing frame is provided on the frame-shaped earth-side land. On the other hand, interdigital transducers (IDT), hot-side patterns, and earth-side patterns are provided on a surface of a SAW element chip to form a functional part. The SAW element is fixed on the base plate with a predetermined space therebetween such that the surface having the IDTs of the SAW element faces the surface of the base plate. The space is hermetically sealed with the solder sealing frame.

However, in the surface acoustic wave device described in Japanese Unexamined Patent Application Publication No. 4-293310, the coefficient of linear expansion in the x direction along a side of the rectangular plate-shaped SAW element is different from the coefficient of linear expansion in the x direction of the base plate. In addition, the coefficient of linear expansion in the y direction, which lies in the plane of the rectangle of the SAW element and is orthogonal to the x direction, is different from the coefficient of linear expansion in the y direction of the base plate. Thus, in the SAW element and the base plate, the coefficients of linear expansion in the same direction are different from each other. Therefore, when a thermal shock is applied during a reliability test or during use, a large difference in expansion is generated between the SAW element and the base plate. Consequently, a strain or a fatigue breaking is generated in the sealed portion, resulting in a sealing failure. This causes a problem that the lifetime for thermal shock resistance required for general electronic component devices cannot be satisfied.

SUMMARY OF THE INVENTION

In order to overcome the problems described above, preferred embodiments of the present invention provide an electronic component device satisfying the lifetime for thermal shock resistance required for general electronic component devices and having excellent reliability.

The preferred embodiments provide an electronic component device including a rectangular plate-shaped element including a front face, a reverse face, a functional part provided on the front face, and a first frame-shaped electrode surrounding the functional part, wherein the coefficient of linear expansion in the x direction along a side of the rectangle is different from the coefficient of linear expansion in the y direction orthogonal to the x direction in the rectangular plane; a substrate including a front face, a reverse face, and a second frame-shaped electrode provided on the front face at a position corresponding to the first frame-shaped electrode; and a solder sealing frame provided on the surface of at least one of the first frame-shaped electrode and the second frame-shaped electrode. In the electronic component device, each of the first frame-shaped electrode, the second frame-shaped electrode, and the solder sealing frame includes a strip-shaped portion extending in the x direction and a strip-shaped portion extending in the y direction, the element and the substrate are bonded with the solder sealing frame, and the functional part provided on the front face of the element is hermetically sealed in a space formed between the element and the substrate. In the electronic component device, the difference in expansion in the x direction between the element and the substrate is represented by $Q_x$ and the difference in expansion in the y direction between the element and the substrate is represented by $Q_y$. Then, in each of the first frame-shaped electrode, the second frame-shaped electrode, and the solder sealing frame, the width of the strip-shaped portion extending in the direction in which the larger difference in expansion is generated between the differences $Q_x$ and $Q_y$ in expansion is smaller than the width of the strip-shaped portion extending in the direction in which the smaller difference in expansion is generated between the differences $Q_x$ and $Q_y$ in expansion.

According to another preferred embodiment of the present invention, the thickness of the solder sealing frame is about 18 μm or more.

According to another preferred embodiment of the present invention, the coefficient of linear expansion in the x direction of the substrate is represented by $A_x$ and the coefficient of linear expansion in the y direction of the substrate is represented by $A_y$. The coefficient of linear expansion in the x direction of the element is represented by $B_x$ and the coefficient of linear expansion in the y direction of the element is represented by $B_y$. The length of the external side of the strip-shaped portion extending in the x direction of the first and second frame-shaped electrodes is represented by $dl_x$ and the length of the external side of the strip-shaped portion extending in the y direction of the first and second frame-shaped electrodes is represented by $dl_y$. Then, the difference $Q_x$ in expansion is represented by $Q_x=|A_x-B_x|\times dl_x$ (mm/° C.), and the difference $Q_y$ in expansion is represented by $Q_y=|A_y-B_y|\times dl_y$ (mm/° C.), the larger difference in expansion between the differences $Q_x$ and $Q_y$ in expansion is about $2.2\times10^{-5}$ (mm/° C.) or less.

According to another preferred embodiment of the present invention, when the ratio of flexural rigidity in the x direction between the element and the substrate is represented by $R_x$ and the ratio of flexural rigidity in the y direction between the element and the substrate is represented by $R_y$, the larger ratio of flexural rigidity between the ratios $R_x$ and $R_y$ of flexural rigidity is about 1.2 or less.

According to another preferred embodiment of the present invention, the element is a surface acoustic wave element.

In the electronic component device according to another preferred embodiment of the present invention, the difference in expansion in the x direction between the element and the substrate is represented by $Q_x$ and the difference in expansion in the y direction between the element and the substrate is represented by $Q_y$. Then, in each of the first frame-shaped electrode, the second frame-shaped electrode, and the solder sealing frame, the width of the strip-shaped portion extending in the direction in which the larger difference in expansion is generated between the differences $Q_x$ and $Q_y$ in expansion is smaller than the width of the strip-shaped portion extending in the direction in which the smaller difference in expansion is generated between the differences $Q_x$ and $Q_y$ in expansion. Therefore, the lifetime for thermal shock resistance can be improved, and thus the lifetime for thermal shock resistance required for general electronic component devices can be satisfied.

In the electronic component device according to another preferred embodiment of the present invention, when the thickness of the solder sealing frame is about 18 μm or more, the lifetime for thermal shock resistance of the electronic component device can be further improved.

In the electronic component device according to another preferred embodiment of the present invention, when the larger difference in expansion between the differences $Q_x$ and $Q_y$ in expansion is about $2.2 \times 10^{-5}$ (mm/° C.) or less, the lifetime for thermal shock resistance of the electronic component device can be further improved.

In the electronic component device according to another preferred embodiment of the present invention, when the larger ratio of flexural rigidity between the ratios $R_x$ and $R_y$ of flexural rigidity is about 1.2 or less, the lifetime for thermal shock resistance of the electronic component device can be further improved.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

As described above, when a thermal shock is applied to the known electronic component device during a reliability test or during use, a strain or a fatigue breaking is generated in the sealed portion, resulting in a problem of sealing failure. For example, in order to check if the lifetime for thermal shock resistance ((high temperature side 85° C., low temperature side −55° C., 30 minutes each/1 cycle)×500 cycles) required for general electronic component devices is satisfied, a thermal shock resistance test was performed (under the same condition as that in the lifetime for thermal shock resistance) using the known electronic component device. As a result, the sealed portion was broken because of a large difference in expansion, resulting in the sealing failure. Thus, the lifetime for thermal shock resistance could not be satisfied.

To evaluate the lifetime for thermal shock resistance, for example, a shock is forcibly applied so that a strain is generated at a joined portion by a solder ball. In this case, the empirical equation of "the Coffin-Manson's law" derived for the resultant strain and the lifetime for thermal shock resistance is represented as follows: (maximum amplitude of equivalent strain)=$0.325 \times$(lifetime (cycle))$^{-0.429}$ (refer to "Kairo jisso gakkaishi" (The Journal of Japan Institute for Interconnecting and Packaging Electronic Circuits), Vol. 12, No. 6 (1997), pp. 413-417, FIG. 7).

The maximum amplitude of equivalent strain in this empirical equation means the dimension of amplitude caused by expansion and contraction of solder during the thermal shock resistance test of an electronic component device. Accordingly, it is known that reducing the maximum amplitude of equivalent strain can improve the lifetime for thermal shock resistance of the electronic component device.

The above empirical equation is an equation relating to the fatigue life (lifetime for thermal shock resistance) for solder bumps. However, since the strain generated in solder is a parameter with generality, this equation can be applied to the lifetime for thermal shock resistance of a sealing frame or the like.

The maximum amplitude of equivalent strain when a thermal shock was applied corresponding to the condition for the lifetime for thermal shock resistance required for general electronic component devices was calculated as about 2.2% by an FEM simulation. In other words, when the maximum amplitude of equivalent strain can be decreased to about 2.2% or less, the lifetime for thermal shock resistance required for general electronic component devices can be satisfied.

Figure 6:
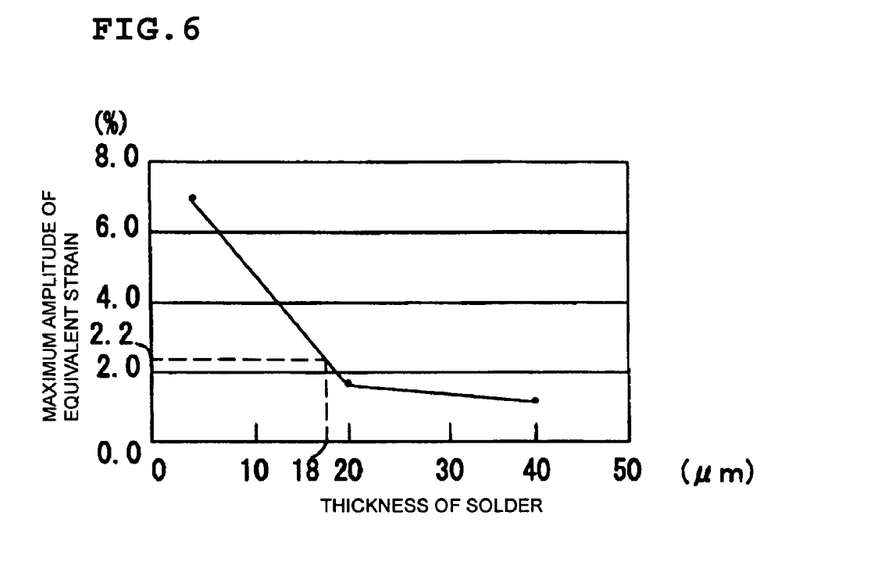
FIG. 6 is a graph showing the relationship between the thickness of a solder sealing frame and the maximum amplitude of equivalent strain.

FIG. 6 is a graph showing the relationship between the thickness of solder and the maximum amplitude of equivalent strain. As shown in FIG. 6, in order to control the maximum amplitude of equivalent strain to about 2.2% or less, the thickness of the solder should be about 18 μm or more.

Figure 7:
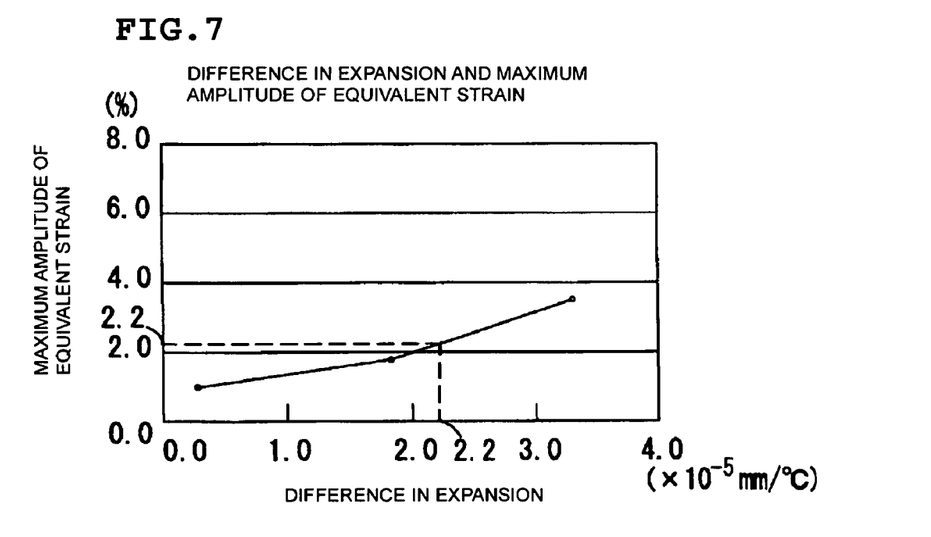
FIG. 7 is a graph showing the relationship between the difference in expansion and the maximum amplitude of equivalent strain.

FIG. 7 is a graph showing the relationship between the difference in expansion and the maximum amplitude of equivalent strain. As shown in FIG. 7, in order to control the maximum amplitude of equivalent strain to about 2.2% or less, the difference in expansion should be about $2.2 \times 10^{-5}$ mm/° C. or less.

Figure 8:
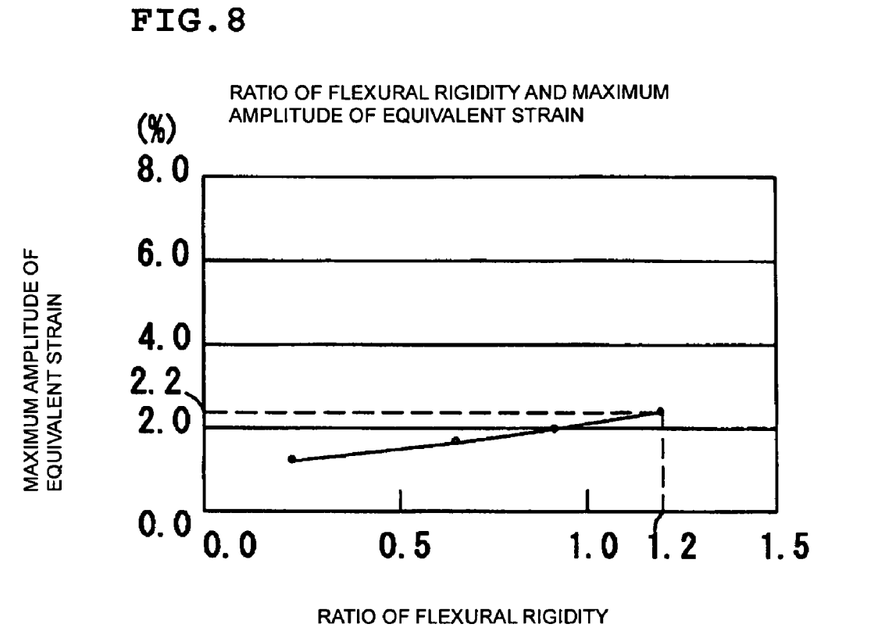
FIG. 8 is a graph showing the relationship between the ratio of flexural rigidity and the maximum amplitude of equivalent strain.

FIG. 8 is a graph showing the relationship between the ratio of flexural rigidity and the maximum amplitude of equivalent strain. As shown in FIG. 8, in order to control the maximum amplitude of equivalent strain to about 2.2% or less, the ratio of flexural rigidity should be about 1.2 or less.

That is, the present inventor has found that, in order to control the maximum amplitude of equivalent strain to about 2.2% or less, the thickness of the solder sealing frame should be about 18 μm or more, the larger difference in expansion between the differences $Q_x$ and $Q_y$ in expansion should be about $2.2 \times 10^{-5}$ mm/° C. or less, and the larger ratio of flexural rigidity between the ratios $R_x$ and $R_y$ of flexural rigidity should be about 1.2 or less.

Furthermore, the present inventor has found the following: In each of the solder sealing frame, a first frame-shaped electrode, and a second frame-shaped electrode, when the width of a strip-shaped portion extending in the direction in which the larger difference in expansion is generated between the differences $Q_x$ and $Q_y$ in expansion is smaller than the width of a strip-shaped portion extending in the direction in which the smaller difference in expansion is generated between the differences $Q_x$ and $Q_y$ in expansion, the lifetime for thermal shock resistance of the electronic component device can be improved.

Herein, each of the differences $Q_x$ and $Q_y$ in expansion means the differences between the coefficient of expansion of a substrate and the coefficient of expansion of an element. The difference $Q_x$ in expansion in the x direction between the element and the substrate and the difference $Q_y$ in expansion in the y direction between the element and the substrate are represented by equations of $Q_x = |A_x - B_x| \times dl_x$ (mm/° C.) and $Q_y = |A_y - B_y| \times dl_y$ (mm/° C.), respectively, wherein $A_x$ represents the coefficient of linear expansion in the x direction of the substrate, $A_y$ represents the coefficient of linear expansion in the y direction of the substrate, $B_x$ represents the coefficient of linear expansion in the x direction of the element, $B_y$ represents the coefficient of linear expansion in the y direction of the element, $dl_x$ represents the length of the external side of the strip-shaped portion extending in the x direction of the first frame-shaped electrode and the second frame-shaped electrode, and $dl_y$ represents the length of the external side of the strip-shaped portion extending in the y direction thereof.

Herein, each of the ratios $R_x$ and $R_y$ of flexural rigidity means the ratio of flexural rigidity of a substrate and the flexural rigidity of an element. The ratio $R_x$ of flexural rigidity in the x direction between the substrate and the element and the ratio $R_y$ of flexural rigidity in the y direction between the substrate and the element are represented by equations of $R_x = (at^3 \cdot a_x \cdot Ea)/(bt^3 \cdot b_x \cdot Eb)$ and $R_y = (at^3 \cdot a_y \cdot Ea)/(bt^3 \cdot b_y \cdot Eb)$, respectively, wherein at represents the thickness of the substrate, $a_x$ represents the length of a side extending in the x direction of the substrate, $a_y$ represents the length of a side extending in the y direction of the substrate, Ea represents the Young's modulus of the substrate, bt represents the thickness of the element, $b_x$ represents the length of a side extending in the x direction of the element, $b_y$ represents the length of a side extending in the y direction of the element, and Eb represents the Young's modulus of the element.

Specific, non-limiting preferred embodiments of the present invention will now be described with reference to the drawings, thereby clarifying the present invention.

Figure 1:
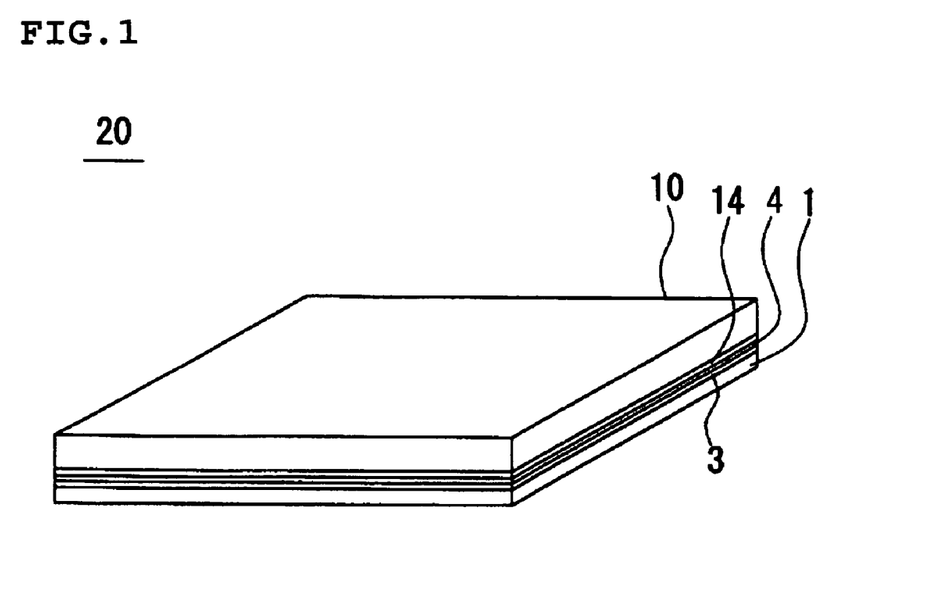
FIG. 1 is a perspective view of an electronic component device according to a preferred embodiment of the present invention.
Figure 2A:
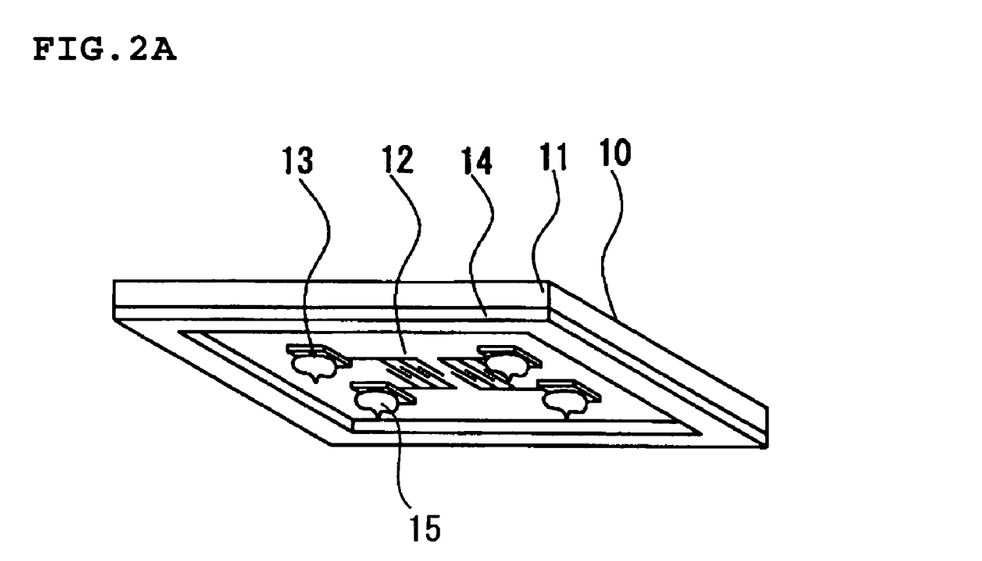
FIGS. 2A and 2B are an exploded perspective view of the electronic component device shown in FIG. 1.
Figure 2B:
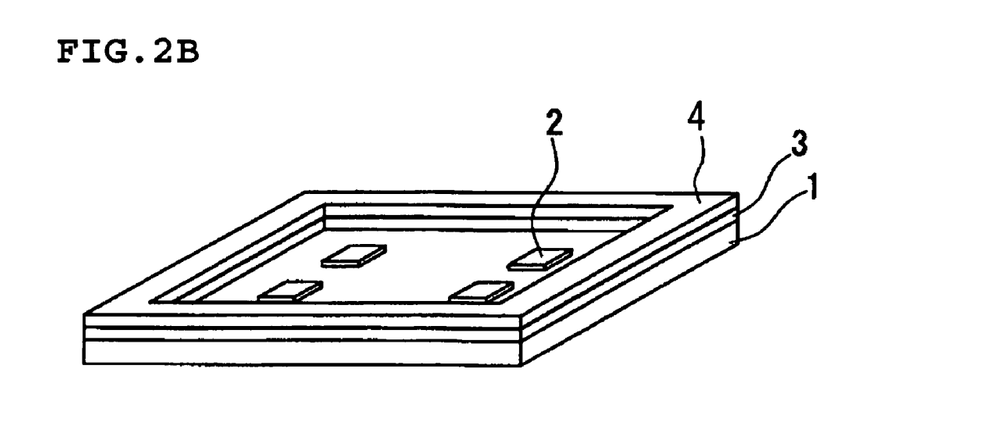

FIG. 1 is a perspective view of an electronic component device 20 according to a preferred embodiment of the present invention and FIGS. 2A and 2B are an exploded perspective view of the electronic component device 20. In the electronic component device 20, an element 10 is mounted face-down on a package substrate 1.

Figure 3A:
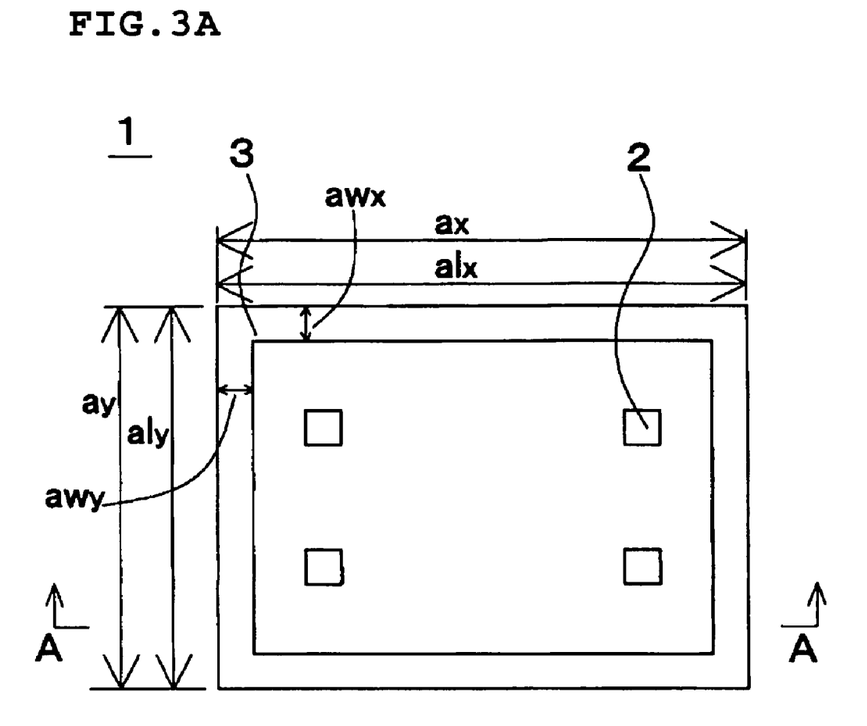
FIG. 3A is a plan view of a package substrate used in the electronic component device in FIG. 1
Figure 3B:
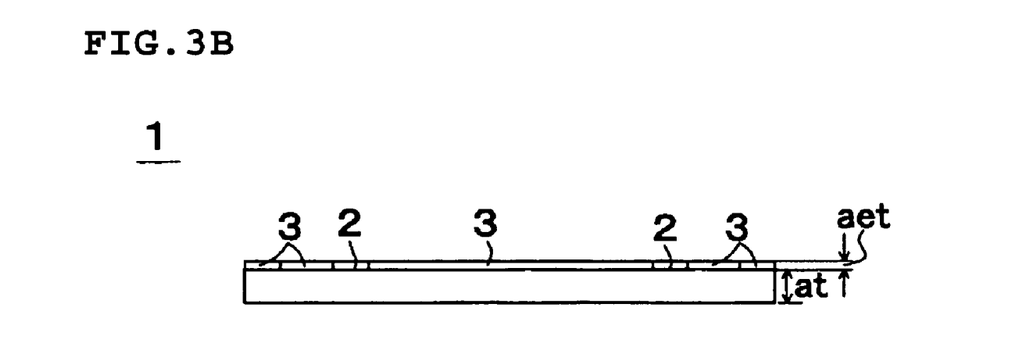
FIG. 3B is a cross-sectional view taken along face A-A in FIG. 3A.

FIG. 3A is a plan view of a package substrate used in the electronic component device 20 and FIG. 3B is a cross-sectional view taken along a face including line A-A in FIG. 3A.

The package substrate 1 is an airtight flat plate component made of a glass epoxy resin. The length $a_x$ of a side extending in the x direction of the package substrate 1 is 2.0 mm, the length $a_y$ of a side extending in the y direction is 2.0 mm, the thickness at is 0.25 mm, and the Young's modulus Ea is 340,000 MPa. Both the coefficient $A_x$ of linear expansion in the x direction of the package substrate 1 and the coefficient $A_y$ of linear expansion in the y direction thereof are 7 ppm/° C.

As shown in FIG. 3A, four rectangular plate-shaped bonding electrodes 2 and a frame-shaped electrode 3 serving as a second frame-shaped electrode (the frame-shaped electrode 14, described below, serves as the first frame-shaped electrode) are provided on the surface of the package substrate 1. The second frame-shaped electrode 3 is disposed so as to surround the bonding electrodes 2. The bonding electrodes 2 are connected to outer electrodes (not shown in the figure) for surface mounting, the outer electrodes being provided on the reverse face, via connecting portions in which an electrode material is embedded in through-holes (not shown in the figure). The frame-shaped electrode 3 is connected to an earth-side electrode (not shown in the figure).

The frame-shaped electrode 3 has a rectangular frame shape and includes strip-shaped portions extending in the x direction and strip-shaped portions extending in the y direction. The length $al_x$ of the external side of each strip-shaped portion extending in the x direction of the frame-shaped electrode 3 is 2.0 mm, the length $al_y$ of the external side of each strip-shaped portion extending in the y direction is 2.0 mm, the width $aw_x$ of the strip-shaped portion extending in the x direction is 0.18 mm, the width $aw_y$ of the strip-shaped portion extending in the y direction is 0.20 mm, and the thickness aet is 0.01 mm.

Figure 5A:
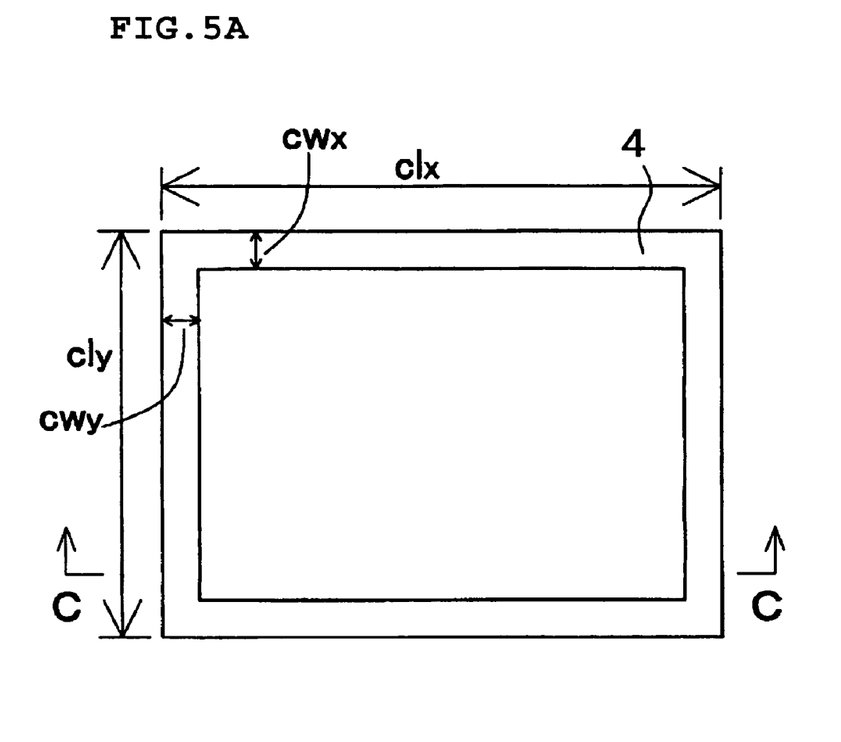
FIG. 5A is a plan view of a solder sealing frame used in the electronic component device in FIG. 1
Figure 5B:
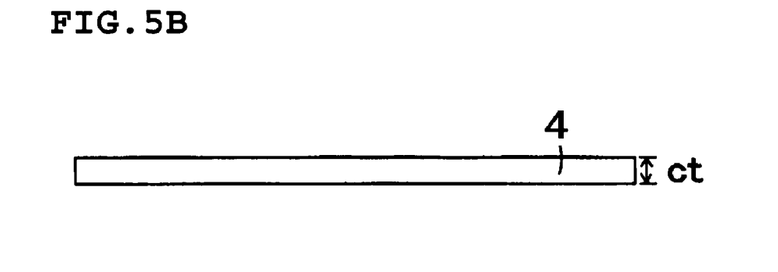
FIG. 5B is a cross-sectional view taken along face C-C in FIG. 5A.

FIG. 5A is a plan view of a solder sealing frame 4 used in the electronic component device 20 and FIG. 5B is a cross-sectional view taken along a face including line C-C in FIG. 5A. The solder sealing frame 4 has a rectangular frame shape and includes strip-shaped portions extending in the x direction and strip-shaped portions extending in the y direction. The length $cl_x$ of the external side of each strip-shaped portion extending in the x direction of the solder sealing frame 4 is 2.0 mm, the length $cl_y$ of the external side of each strip-shaped portion extending in the y direction is 2.0 mm, the width $cw_x$ of the strip-shaped portion extending in the x direction is 0.18 mm, the width $cw_y$ of the strip-shaped portion extending in the y direction is 0.20 mm, and the thickness ct is 0.02 mm. The solder sealing frame 4 is provided on the frame-shaped electrode 3 of the package substrate 1. For example, eutectic solder paste is applied on the frame-shaped electrode 3 of the package substrate 1 by printing and the eutectic solder paste is subjected to reflow soldering. Subsequently, cleaning is performed to remove the flux residue. Thus, the solder sealing frame 4 is formed. In addition to the printing, the solder sealing frame 4 may be formed by precoating such as the SJ process, plating, vacuum deposition, sputtering, or the like. Although eutectic solder is used as the material of the solder sealing frame 4, the material is not limited to eutectic solder as long as the material is a metal that can be melted.

Figure 4A:
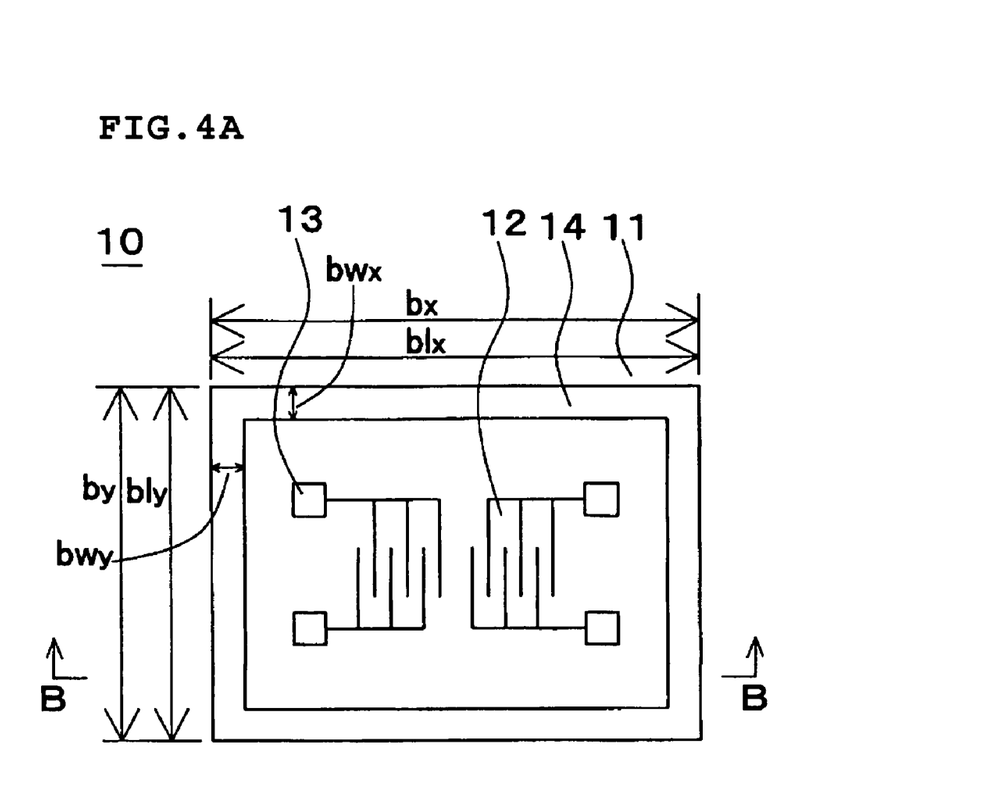
FIG. 4A is a plan view of an element used in the electronic component device in FIG. 1
Figure 4B:
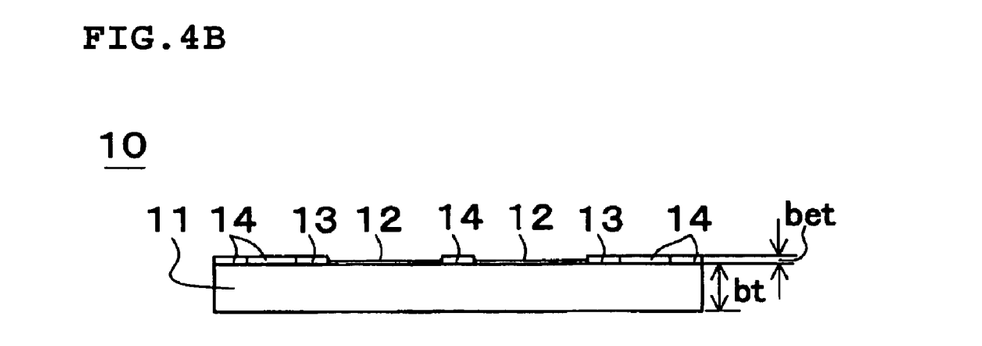
FIG. 4B is a cross-sectional view taken along face B-B in FIG. 4A.

FIG. 4A is a plan view of the element 10 used in the electronic component device 20 and FIG. 4B is a cross-sectional view taken along a face including line B-B in FIG. 4A. The element 10 is a rectangular plate-shaped surface acoustic wave element. The length $b_x$ of a side extending in the x direction of the element 10 is 2.0 mm, the length $b_y$ of a side extending in the y direction is 2.0 mm, the thickness bt is 0.35 mm, and the Young's modulus Eb is 230,000 MPa.

The element 10 includes a piezoelectric substrate 11 composed of quartz crystal, $LiTaO_3$, $LiNbO_3$, or the like and a functional part provided on the piezoelectric substrate 11. The functional part includes two pairs of IDTs 12 made of Al or the like and four input-output electrodes 13 made of Ti/Ni/Au. The IDTs 12 and the input-output electrodes 13 are connected to each other. The coefficient $B_x$ of linear expansion of a side extending in the x direction of the element 10 is 16 ppm/° C. and the coefficient $B_y$ of linear expansion of a side extending in the y direction of the element 10 is 9 ppm/° C. The coefficient of linear expansion of the side extending in the x direction is different from the coefficient of linear expansion of the side extending in the y direction.

A frame-shaped electrode 14 serving as a first frame-shaped electrode is provided on the surface of the element 10 so as to surround the IDTs 12 and the input-output electrodes 13. The frame-shaped electrode 14 has a rectangular frame shape and includes strip-shaped portions extending in the x direction and strip-shaped portions extending in the y direction. The length $bl_x$ of the external side of each strip-shaped portion extending in the x direction of the frame-shaped electrode 14 is 2.0 mm, the length $bl_y$ of the external side of each strip-shaped portion extending in the y direction is 2.0 mm, the width $bw_x$ of the strip-shaped portion extending in the x direction is 0.18 mm, the width $bw_y$ of the strip-shaped portion extending in the y direction is 0.20 mm, and the thickness bet is 0.001 mm.

As shown in FIG. 2A, bumps 15 are fixed on the input-output electrodes 13. The bumps 15, which are Au bumps, are formed by a wire bonding process. In place of the Au bumps, metal bumps mainly made of Ag, Pd, and Cu solder bumps, or the like may also be used. In place of the wire bonding process, the bumps 15 may be formed by plating, a process of setting solder balls, printing, or the like. The height of the bumps 15 is preferably higher than the height of the solder sealing frame 4 formed on the package substrate 1 and is preferably about 40 μm to about 50 μm.

In the package substrate 1 and the element 10, the length of the sides extending in the x direction and the length of the sides extending in the y direction are substantially the same. Each of the bonding electrodes 2 of the package substrate 1 and each of the input-output electrodes 13 of the element 10 are disposed at corresponding positions. The frame-shaped electrode 3 of the package substrate 1 and the frame-shaped electrode 14 of the element 10 are also disposed at corresponding positions.

The frame-shaped electrodes 3 and 14 are made of Ni/Au. Nickel is used in order to prevent solder corrosion. A metal other than Ni may be used as long as the metal can prevent solder corrosion. In addition to Ni, examples of such a metal include Pt and Pd. Gold is used in order to ensure solderability. A metal other than Au may be used as long as the metal can ensure solderability. In addition to Au, examples of such a metal include Ag, Sn, Pt, and Cu.

A method for bonding the package substrate 1 and the element 10 will now be described.

As shown in FIG. 2A, an element 10 including IDTs 12, input-output electrodes 13, a frame-shaped electrode 14, and bumps 15 and, as shown in FIG. 2B, a package substrate 1 including bonding electrodes 2, a frame-shaped electrode 3, and a solder sealing frame 4 are prepared.

The package substrate 1 is placed on a support such that the solder sealing frame 4 is disposed on the upper side, and the position of the package substrate 1 is fixed. Subsequently, the reverse face of the element 10 is applied with a vacuum with a bonding tool. The element 10 is positioned such that the frame-shaped electrode 3 of the package substrate 1 and the frame-shaped electrode 14 of the element 10 correspond below and above. Subsequently, a pressure is applied with ultrasonic waves using the bonding tool to bond the bumps 15 with the bonding electrodes 2 of the package substrate 1. Thereby, the bumps 15 and the bonding electrodes 2 of the package substrate 1 undergo diffusion bonding. At the same time, the melted solder sealing frame 4 is spread on the frame-shaped electrode 14 of the element 10 with wettability to hermetically seal the space between the package substrate 1 and the element 10.

Finally, the resulting package substrate 1 and the element 10 are cooled to complete the bonding and sealing. Thus, a hermetically sealed electronic component device 20 can be produced.

With respect to the electronic component device 20, the differences $Q_x$ and $Q_y$ in expansion generated between the package substrate 1 and the element 10 will be calculated.

The differences $Q_x$ and $Q_y$ in expansion in the electronic component device 20 are calculated as follows: The difference $Q_x$ in expansion is |7 ppm/° C.−16 ppm/° C.|×2.0 mm=$1.8×10^{-6}$ mm/° C., and the difference $Q_y$ in expansion is |7 ppm/° C.−9 ppm/° C.|×2.0 mm=$4.0×10^{-7}$ mm/° C. Thus, the difference $Q_x$ in expansion is larger than the difference $Q_y$ in expansion.

In the electronic component device 20, the width $cw_x$ of the strip-shaped portion extending in the x direction of the solder sealing frame 4 and widths $aw_x$ and $bw_x$ of the strip-shaped portions extending in the x direction of the frame-shaped electrodes 3 and 14, respectively, are 0.18 mm. On the other hand, the width $cw_y$ of the strip-shaped portion extending in the y direction of the solder sealing frame 4 and widths $aw_y$ and $bw_y$ of the strip-shaped portions extending in the y direction of the frame-shaped electrodes 3 and 14, respectively, are 0.20 mm. In the electronic component device 20, the difference $Q_x$ in expansion is larger than the difference $Q_y$ in expansion. That is, the widths $aw_x$, $bw_x$, and $cw_x$ of the strip-shaped portions extending in the x direction of the frame-shaped electrodes 3 and 14 and the solder sealing frame 4 are smaller than the widths $aw_y$, $bw_y$, and $cw_y$ of the strip-shaped portions extending in the y direction.

When the width of the strip-shaped portion extending in the direction in which the larger difference in expansion is generated between the differences $Q_x$ and $Q_y$ in expansion is smaller than the width of the strip-shaped portion extending in the direction in which the smaller difference in expansion is generated between the differences $Q_x$ and $Q_y$ in expansion, the electronic component device 20 can be miniaturized. On the other hand, in the solder sealing frame 4 and the frame-shaped electrodes 3 and 14, the maximum equivalent strains generated in the sides extending in the direction in which the larger difference in expansion is generated are barely changed. Accordingly, the electronic component device 20 can satisfy the lifetime for thermal shock resistance required for general electronic component devices.

Furthermore, in the electronic component device 20, the thickness ct of the solder sealing frame 4 is 0.02 mm (20 μm). By increasing the thickness of the solder sealing frame 4 to about 18 μm or more, when a thermal shock is applied during a reliability test or during use, a strain generated at the sealed portion between the package substrate 1 and the element 10 can be absorbed by the solder sealing frame 4. Accordingly, in the electronic component device 20, the maximum amplitude of equivalent strain generated in the solder sealing frame 4 can be reduced to about 2.2% or less.

In the electronic component device 20, the difference $Q_x$ in expansion is larger than the difference $Q_y$ in expansion. Accordingly, when the difference $Q_x$ in expansion is about $2.2×10^{-5}$ mm/° C. or less, the maximum amplitude of equivalent strain generated in the solder sealing frame 4 can be reduced to about 2.2% or less. Since the difference $Q_x$ in expansion is about $1.8 \times 10^{-6}$ mm/°C., which satisfies the condition of about $2.2 \times 10^{-5}$ mm/°C. or less, in the electronic component device 20, the maximum amplitude of equivalent strain generated in the solder sealing frame 4 can be reduced to about 2.2% or less.

With respect to the electronic component device 20, the ratios $R_x$ and $R_y$ of flexural rigidity in the package substrate 1 and the element 10 will be calculated.

The ratios $R_x$ and $R_y$ of flexural rigidity in the electronic component device 20 are calculated as follows: The ratio $R_x$ of flexural rigidity is $(0.25^3 \text{ mm} \times 2.0 \text{ mm} \times 340{,}000 \text{ MPa})/(0.35^3 \text{ mm} \times 2.0 \text{ mm} \times 230{,}000 \text{ MPa})$ and the ratio $R_y$ of flexural rigidity is $(0.25^3 \text{ mm} \times 2.0 \text{ mm} \times 340{,}000 \text{ MPa})/(0.35^3 \text{ mm} \times 2.0 \text{ mm} \times 230{,}000 \text{ MPa})$. The ratio $R_x$ of flexural rigidity and the ratio $R_y$ of flexural rigidity are the same value of about 0.54.

The ratios $R_x$ and $R_y$ of flexural rigidity in the electronic component device 20 are about 0.54, which satisfies the condition of about 1.2 or less. Therefore, in the electronic component device 20, the maximum amplitude of equivalent strain generated in the solder sealing frame 4 can be reduced to about 2.2% or less.

As described above, the maximum amplitude of equivalent strain generated in the solder sealing frame 4 can be reduced to about 2.2% or less in the electronic component device 20. Consequently, even when a thermal shock is applied during a reliability test or during use, a strain or a fatigue breaking that is generated in the solder sealing frame 4 can be suppressed and thus sealing failure due to breaking of the sealed portion does not occur.

Consequently, the electronic component device 20 has further improved lifetime for thermal shock resistance and excellent reliability.

In the above preferred embodiment, the solder sealing frame 4 is provided on the package substrate 1. Alternatively, the solder sealing frame 4 may be provided on the element 10 or may be provided on each of the package substrate 1 and the element 10. When the solder sealing frames 4 are provided on both the package substrate 1 and the element 10, the solder sealing frames are bonded with each other to perform sealing.

With respect to the solder sealing frame 4, the solder sealing frame 4 need not be entirely made of a base metal. It is sufficient that at least the surface thereof is made of a base metal.

In place of metal bumps or solder bumps, base metal bumps such as Al bumps may be used as the bumps 15.

A surface acoustic wave element is used as the element 10 in the above preferred embodiment. Alternatively, another element such as a high-frequency element may also be used as long as the coefficient of linear expansion in the x direction is different from the coefficient of linear expansion in the y direction.

A glass epoxy resin is used for the package substrate 1 in the above preferred embodiment. Alternatively, another airtight substrate, for example, a glass substrate, a ceramic substrate made of alumina or the like, or a crystalline substrate may also be used.

The solder sealing frame 4 may be connected to an earth-side circuit pattern (not shown in the figure) provided on the package substrate 1.

While the present invention has been described with respect to preferred embodiments thereof, it will be apparent to those skilled in the art that the disclosed invention may be modified in numerous ways and may assume many preferred embodiments other those specifically set out and described above. Accordingly, it is intended by the appended claims to cover all modifications of the present invention which fall within the true spirit and scope of the invention.

The invention claimed is:

1. An electronic component device comprising:
a rectangular plate-shaped element including a functional part and a first frame-shaped electrode surrounding the functional part, wherein the coefficient of linear expansion in the x direction along a side of the rectangle is different from the coefficient of linear expansion in the y direction orthogonal to the x direction in the rectangular plane;
a substrate including a second frame-shaped electrode arranged on a front face of the substrate at a position so as to correspond to the first frame-shaped electrode; and
a solder sealing frame provided on the surface of at least one of the first frame-shaped electrode and the second frame-shaped electrode; wherein
each of the first frame-shaped electrode, the second frame-shaped electrode, and the solder sealing frame includes a strip-shaped portion extending in the x direction and a strip-shaped portion extending in the y direction;
the element and the substrate are bonded together with the solder sealing frame, the functional part provided on the element is hermetically sealed in a space formed between the element and the substrate; and
when the difference in expansion in the x direction between the element and the substrate is represented by $Q_x$ and the difference in expansion in the y direction between the element and the substrate is represented by $Q_y$, in each of the first frame-shaped electrode, the second frame-shaped electrode, and the solder sealing frame, a width of the strip-shaped portion extending in the direction having the larger difference in expansion is smaller than a width of the strip-shaped portion extending in the direction having the smaller difference in expansion.

2. The electronic component device according to claim 1, wherein the thickness of the solder sealing frame is about 18 μm or more.

3. The electronic component device according to claim 1, wherein when the coefficient of linear expansion in the x direction of the substrate is represented by $A_x$, the coefficient of linear expansion in the y direction of the substrate is represented by $A_y$, the coefficient of linear expansion in the x direction of the element is represented by $B_x$, the coefficient of linear expansion in the y direction of the element is represented by $B_y$, the length of the external side of the strip-shaped portion extending in the x direction of the first and second frame-shaped electrodes is represented by $dl_x$, the length of the external side of the strip-shaped portion extending in the y direction of the first and second frame-shaped electrodes is represented by $dl_y$, the difference $Q_x$ in expansion is represented by $Q_x = |A_x - B_x| \times dl_x (\text{mm}/^\circ\text{C.})$, and the difference in expansion is represented by $Q_y = |A_y - B_y| \times dl_x (\text{mm}/^\circ\text{C.})$, then the larger difference in expansion is about $2.2 \times 10^{31}$ $^5$(mm/°C.) or less.

4. The electronic component device according to claim 1, wherein when the ratio of flexural rigidity in the x direction between the element and the substrate is represented by $R_x$ and the ratio of flexural rigidity in the y direction between the element and the substrate is represented by $R_y$, the larger ratio of the flexural rigidity ratios $R_x$ and $R_y$ is about 1.2 or less.

5. The electronic component device according to claim 1, wherein the element is a surface acoustic wave element.

6. The electronic component device according to claim 1, wherein the element is a high frequency element.

7. An electronic component device comprising:
a rectangular plate-shaped element including a functional part and a first frame-shaped electrode, wherein the coefficient of linear expansion in the x direction along a side of the rectangle is different from the coefficient of linear expansion in the y direction orthogonal to the x direction in the rectangular plane; and
a substrate including a second frame-shaped electrode; wherein
each of the first frame-shaped electrode and the second frame-shaped electrode includes a strip-shaped portion extending in the x direction and a strip-shaped portion extending in the y direction; the element and the substrate are bonded together with the functional part provided on the element hermetically sealed in a space formed between the element and the substrate; and
when the difference in expansion in the x direction between the element and the substrate is represented by $Q_x$ and the difference in expansion in the y direction between the element and the substrate is represented by $Q_y$, in each of the first frame-shaped electrode and the second frame-shaped electrode, a width of the strip-shaped portion extending in the direction having the larger difference in expansion is smaller than a width of the strip-shaped portion extending in the direction having the smaller difference in expansion.

* * * * *